United States Patent [19]

Freels et al.

[11] Patent Number: 5,022,384

[45] Date of Patent: Jun. 11, 1991

[54] VIBRATING/MASSAGE CHAIR

[75] Inventors: Jack Freels; David Milton, both of Sacramento, Calif.

[73] Assignee: Capitol Systems, Sacramento, Calif.

[21] Appl. No.: 522,976

[22] Filed: May 14, 1990

[51] Int. Cl.⁵ .......................... A61H 1/00; H03K 3/06

[52] U.S. Cl. .......................................... 128/33; 128/36; 318/129; 331/145

[58] Field of Search .................... 128/36, 33; 318/129, 318/130, 132; 331/145

[56] References Cited

U.S. PATENT DOCUMENTS

| | | | |
|---|---|---|---|
| 3,355,633 | 11/1967 | Klix | 318/129 X |
| 3,373,378 | 3/1968 | Cottrell | 331/145 |
| 3,446,204 | 5/1969 | Murphy | 128/33 |
| 3,613,671 | 10/1971 | Poor et al. | 128/24 R |
| 3,854,474 | 12/1974 | Carruth | 128/33 |
| 3,922,589 | 11/1975 | Peckingham | 318/126 |
| 4,105,024 | 8/1978 | Raffel | 128/33 |
| 4,232,661 | 11/1980 | Christensen | 128/33 |
| 4,370,602 | 1/1983 | Jones, Jr. et al. | 318/114 |
| 4,465,158 | 8/1984 | Yamazaki et al. | 297/284 |
| 4,544,867 | 10/1985 | Jones, Jr. et al. | 318/129 |
| 4,559,929 | 12/1985 | Hseu | 128/33 |
| 4,686,967 | 8/1987 | Hashimoto et al. | 128/57 |
| 4,697,580 | 10/1987 | Terauchi | 128/36 |
| 4,718,408 | 1/1988 | Barreiro | 128/52 |
| 4,748,972 | 6/1988 | Hasegawa | 128/24 A |
| 4,785,798 | 11/1988 | Yamasaki | 128/46 |
| 4,851,743 | 7/1989 | Schmerda | 388/811 |

*Primary Examiner*—Edgar S. Burr
*Assistant Examiner*—E. P. Raciti
*Attorney, Agent, or Firm*—John P. O'Banion

[57] ABSTRACT

A device for creating vibration within a chair which provides a therapeutic benefit to users. The chair has a control for adjusting the frequency of the vibrations and the amplitude of the vibrations, providing a wide variety of therapeutic results. The circuit powering the vibration sources within the chair employs a unique design that acts as a heat sink, effectively drawing heat away from the vibration sources and thus extending their useful life. The vibration sources may be incorporated into the seating furniture of vehicles such as automobiles or airplanes to provide relief from the strain associated with trips of extended duration. The structure has a sufficiently low profile to lend itself to placement in seating used in vehicles which have rather stringent dimensional requirements.

17 Claims, 3 Drawing Sheets

VIBRATING/MASSAGE CHAIR

FIELD OF THE INVENTION

This invention relates generally to seating furniture including vibrational sources and a variable control circuit therefor to provide comfort and relief from strain. The device can also be used in a variety of vehicles to relieve passengers from the discomfort of long trips.

BACKGROUND OF THE INVENTION

The prior art in this area contains vibrational devices and seating furniture with incorporated vibrational devices. It is stipulated, however, that none of these prior inventions teach singly, nor render obvious when combined, the nexus of the instant invention as described and claimed subsequently.

It is known in the prior art to teach the incorporation of vibrational devices within sitting furniture; however these devices do not extend this configuration into the vehicle environment strategically placed, profiled and variable, where the need for comfort is heightened due to a restricted ability to move about while traveling. Furthermore, the prior art fails to incorporate the advantages of adjustability of frequency and amplitude of vibration into any of their vibrational seating devices.

The following patents reflect the state of the art of which applicant is aware and are tendered with the view towards discharging applicants' acknowledged duty of candor in disclosing relevant known prior art to the Patent Office. It is respectfully stipulated, however, that none of these patents teach when considered singly nor render obvious when considered in any conceivable combination, the claimed nexus of applicant's structure.

| INVENTOR | PATENT NO. | ISSUE DATE |
|---|---|---|
| Poor, J. H. | 3,613,671 | October 19, 1971 |
| Carruth, E. I. | 3,854,474 | December 17, 1974 |
| Christensen, E. | 4,232,661 | November 11, 1980 |
| Yamazaki et al. | 4,465,158 | August 14, 1984 |
| Hseu | 4,559,929 | December 24, 1985 |
| Jefferson, LV. | 4,607,624 | August 26, 1986 |
| Hashimoto et al. | 4,686,967 | August 18, 1987 |
| Barreiro, A. | 4,718,408 | January 12, 1988 |
| Hasegawa, T. | 4,748,972 | June 7, 1988 |
| Yamasaki, Y. | 4,785,798 | November 22, 1988 |
| Schmerda et al. | 4,851,743 | July 25, 1989 |

The patent to Yamazaki et al. is of interest since it teaches the use of a safety device for a vehicle seat which incorporates a vibrator therewithin. In essence, the focal point of this invention is to disable the electronic control circuit which energizes the vibrator in response to movement of the vehicle. In this way, the vibrator can only work when the car is stationary.

The patent to Hasegawa teaches the use of a vehicle seat fitted with a massaging device in which a motor is disposed within an associated chamber and a coiled spring is arranged in an associated, related spring chamber with operative coupling between the motor and the coiled spring. In this way, when the motor is rotated at a speed high enough to generate vibration, the coiled spring resonates therewith.

The patent to Christensen teaches the use of a body-massage apparatus wherein the circuit associated therewith energizes a motor by a train of triangular pulses modulated by a triangular pulse signal having a lower frequency than that of the triangular pulse train.

The remaining citations show the state of the art further and are believed to diverge even further from the claimed nexus of the instant invention.

SUMMARY OF THE INVENTION

The instant invention is distinguished over the known prior art in a plurality of ways. One aspect of differentiation involves the housing according to the instant invention within which the vibrating instrumentality is disposed. In essence, the housing is formed from two half-shells collectively joined together to form an oval-shaped container within which the motor and eccentric is to be housed. The oval hollow is circumscribed by a flange extending along an area of juncture between the upper and lower shell portions. The housing in turn is nested within a hollowed out area on a conventional low profile seat commonly used in industries such as the automotive, aeronautical, mass transit, and theater seating industries. In essence, the foam associated with a portion of the chair is hollowed out to receive the vibrator housing therewithin. A peripheral flange of the housing may extend within a slit formed in the foam in order to beneficially enhance the vibratory pattern emanating therefrom.

The rotational characteristic of the motor is controlled by a novel circuit which resolves a long-standing problem which has heretofore gone unresolved with respect to heat dissipation in controlling DC motors. In essence, an entire circuit loop is operatively coupled to the circuit to act, as a whole, as a component heat sink.

Moreover, a voltage comparator and its accompanying gain loop which consists of a capacitor and series of resistors acts as a voltage stabilizer and regulator thereby supplying pulse width modulation in a novel manner with respect to vibrator circuits heretofore unknown in the prior art. In this way, motor protection has been effected with a minimal amount of unwanted heat generation, which has plagued prior art.

OBJECTS OF THE INVENTION

The primary object of this invention is to provide a vibration source for reduction of strain in a user's muscles and joints, especially that strain produced from being seated for long, continuous periods.

A further object of this invention is to incorporate the vibration source into a chair. In this way the user need not go through cycles of experiencing strain and seeking relief, but rather can be massaged while in the seat that would otherwise cause the strain.

A still further object of this invention is to provide the vibration source with a control circuit whereby the frequency and amplitude of the vibration waves can be adjusted.

Another object of this invention is to incorporate a seat fitted with a vibration source into a vehicle such as a car or plane. In this way the strain produced from long trips in cramped quarters may be alleviated.

Another further object of this invention is to extend the operational life of the vibration source through unique heat dissipation from the circuit driving the vibration source.

A further object of this invention is to enclose each vibration source in a separate enclosure facilitating ease of replacement and effective vibration propagation from the source to the use.

A further object of the present invention is to provide a device as characterized above wherein an outer facia covering upper and lower furniture portions is provided having sufficient thickness and consistency to ameliorate and soften inner structural components which otherwise would directly contact an individual when in use.

A further object of the present invention is to provide a device as characterized above wherein a power cord is provided which connects a motor to a power supply with a junction whereby additional vibration sources may be connected to the power supply.

A further object of the present invention is to provide a device as characterized above wherein an electric circuit for providing a desired signal with substantial heat dissipating characteristics is provided and, when taken as a whole, acts as a heat sink.

Viewed from one vantage point, it is an object of the present invention to provide a chair-like article of furniture for providing vibrational sensation having an upper furniture back portion providing support for a user's upper torso, a lower furniture seat portion providing support for the user's lower torso, wherein the lower seat and upper back portions are operatively coupled to generally define a chair. A plurality of electric motor vibration sources are located within the upper portion and lower portion of the furniture, a plurality of heat dissipating circuits are located between a power source and the vibration sources thereby reducing potential damage to the vibration source, a motor driving circuit which includes a comparator that supplies both pulse-width modulation and voltage regulation/stabilization while providing necessary voltage to drive said motor, and a speed control external to said circuit and operatively coupled thereto allows variation in vibrational frequency of said furniture.

Viewed from a second vantage point, it is an object of the present invention to provide a vibrational source for use in vehicle furniture which has a low profile comprising in combination: an electric motor, a load shaft extending from said motor, an eccentric mass fixedly attached to said load shaft of said motor, a housing within which said motor and said eccentric mass are securely mounted, said housing including an upper cover with a plurality of screw holes and a lower base with a plurality of threaded columns fastened together with a plurality of screws, and a power cord connecting said motor to a power supply with a junction whereby additional vibration sources may be connected to said power supply.

Viewed from yet a third vantage point, it is another object of the present invention to provide an electric circuit for providing a desired signal with substantial heat dissipating characteristics comprising in combination: a power source, a comparator operatively conditioned by said source for regulating voltage from said source for a voltage driven Mega FET, and a transistor loop operatively coupled to said source, said comparator and Mega FET including a plurality of resistors which, taken as a whole, acts as a component heat sink.

BRIEF DESCRIPTION OF THE DRAWING FIGURES

BRIEF DESCRIPTION OF THE PREFERRED EMBODIMENT

Considering now the drawings where like references denote like parts, reference number 100 is directed to a chair including a vibration source for the relief of strain.

Figure 1:
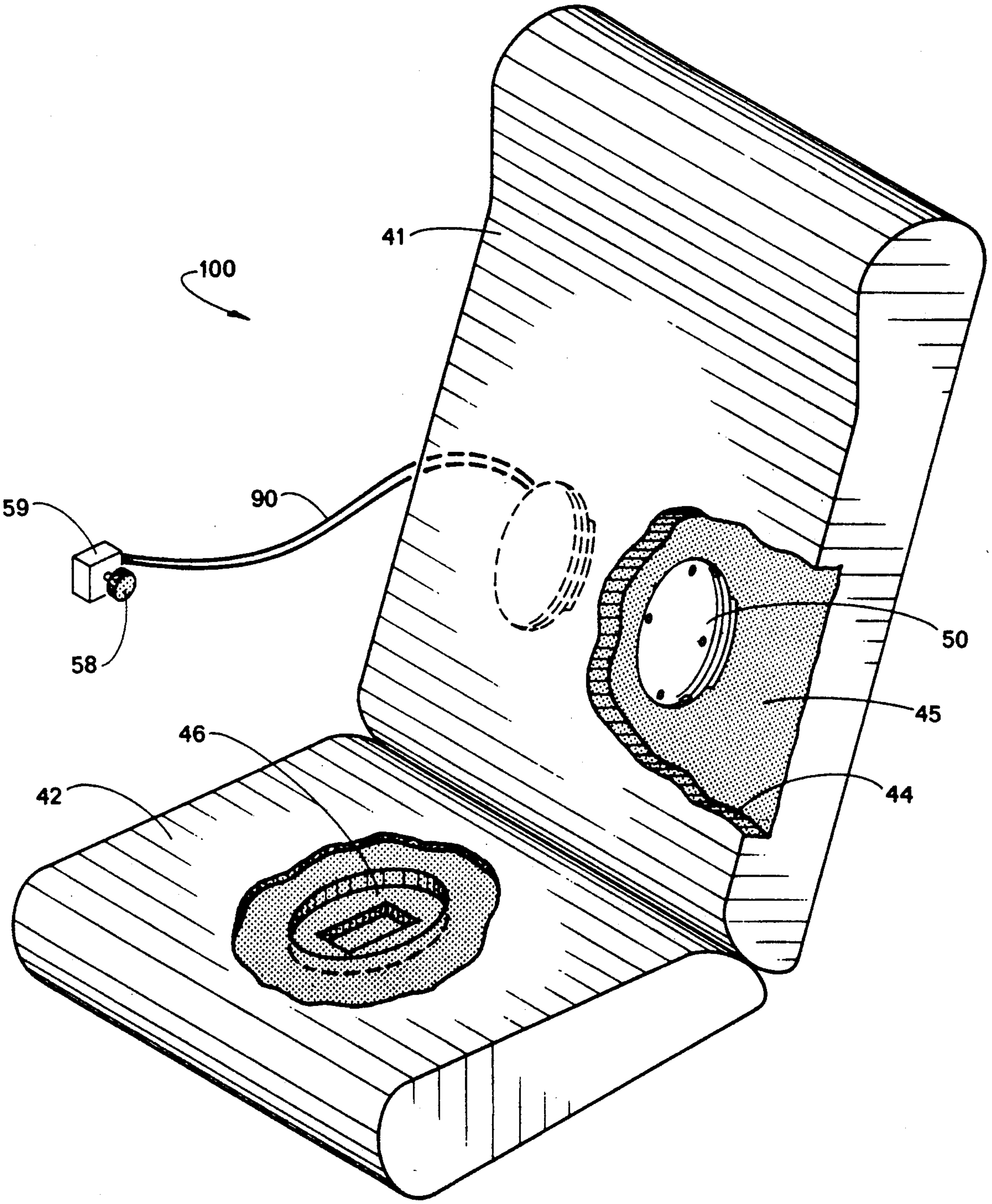
FIG. 1 is an isometric view of the furniture with included facia, core for containing a oval-shaped housing and a power cord with an adjustment switch.

The device consists of a vibration chair 100 as depicted in FIG. 1 consisting of an upper furniture portion 41, a lower furniture portion 42, and a plurality of vibration sources 50. Both the upper furniture portion 41 and lower furniture portion 42 are preferably comprised of:

1. an outer facia or membrane 44 completely covering the upper furniture portion 41 and the lower furniture portion 42, and coming in contact with the user;
2. a central core 45 within the outer facia 44;
3. a plurality of cavities 46 similar in size and shape to the exterior of the vibrational source 50; and
4. a support frame (not shown) which may be provided.

The central core 45 provides structural support for the vibration chair 100 and acts as a medium for propagation of the vibration waves from the vibration sources 50 to the outer facia 44 and on to the user. The outer facia 44 provides a buffer layer forming a more even distribution of the vibrational energy, and provides a substantially uniform surface. The core 45 may include a frame reinforcement. The facia may be upholstered.

Figure 2:
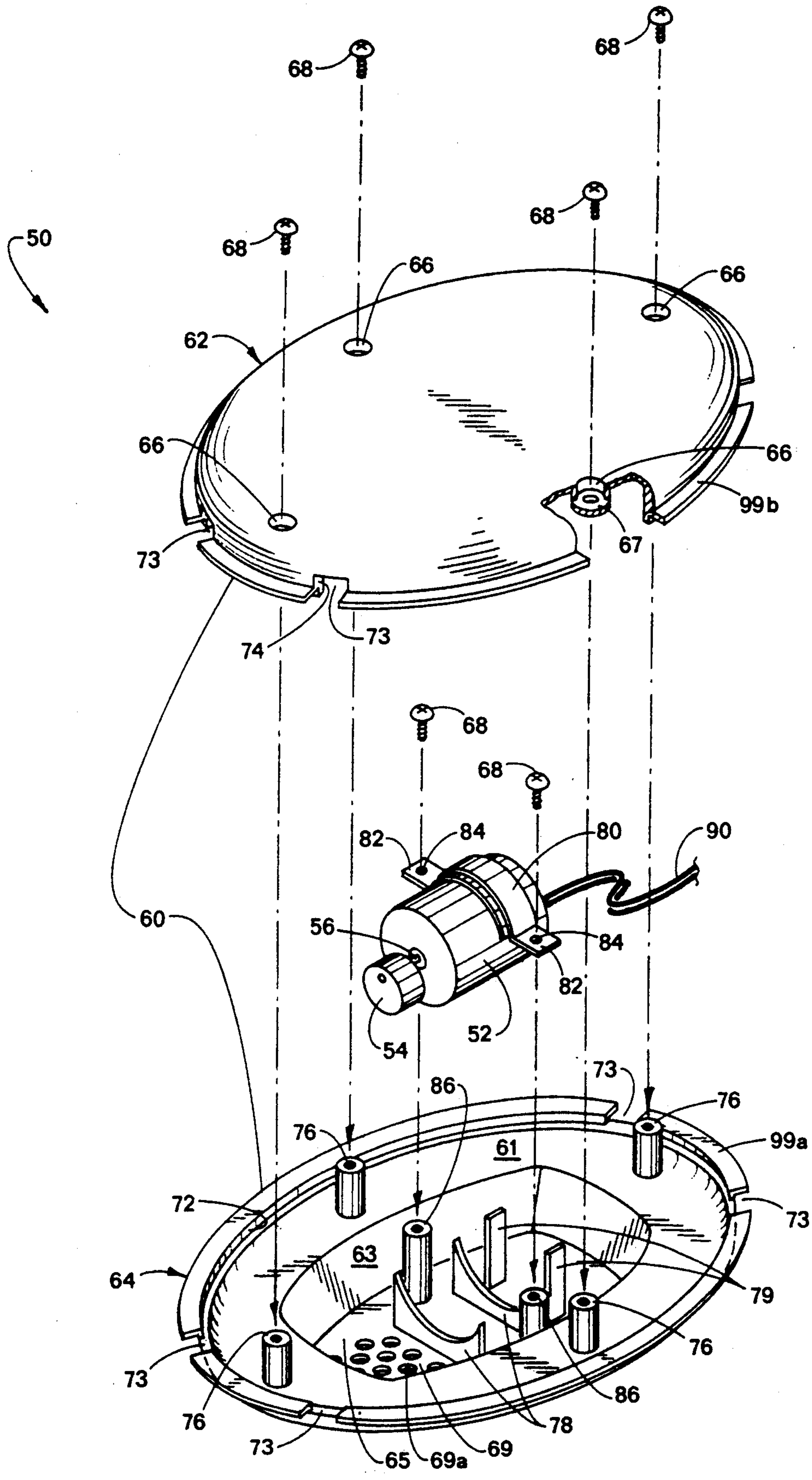
FIG. 2 is an exploded view of the oval-shaped housing with included vibration source.

Referring now to FIG. 2 where a vibration source 50 is described in detail, the exterior of the vibration source 50 is formed by an oval-shaped housing 60. The cavities 46 of FIG. 1 substantially conform in size to the external contour of the housing 60 so that the vibration source 50 can fit snugly within and effectively propagate vibrations from the vibration source 50 to the user.

The oval-shaped housing 60 is composed of a cover 62 and a base 64. The cover 62 is primarily an oval-shaped construct with a hollowed out under side, forming a domed lid for the oval-shaped housing 60. The cover 62 has a plurality of screw holes 66 near its perimeter designed to allow screws 68 to pass therethrough, fixing the cover 62 in place on top of the base 64. Each screw hole 66 has a recessed portion 67 to allow the heads of the screws 68 to sink below the upper surface of the cover 62. The cover 62 also has a downwardly extending lip 74 along the edge of the cover 62. Gaps 73 in the downwardly extending lip 74 exist to allow a power cord 90 to pass therethrough. The downwardly extending lip 74 allows the cover 62 to fit snugly over the base 64.

The base 64 also has an upwardly extending lip 72 along the edge of the base 64. This upwardly extending lip 72 is slightly greater in perimeter than the downwardly extending lip 74 of the cover 62 allowing the cover 72 and base 64 to come together with a close fit. Gaps 73 in the upwardly extending lip 72 exist to allow the power cord 90 to pass therethrough.

The base 64 is primarily an oval-shaped construct with a hollowed out upper side, and a somewhat rectangularly shaped recess 65 in the center of the base 64. Recess 65 includes a floor 69 having ventilation apertures 69*a*. Side edges of recess 65 have an arcuate contour and side walls 63 of the recess are also both curved and slope outwardly to lip 72. A plurality of threaded columns 76 are fixedly attached to the upper side of the base 64 but outside the recess 65, supported on a shelf 61 which peripherally circumscribes side walls 63. The columns 76 extend upwardly with the open portion on top facing the cover 62. Each threaded column 76 is in line with the screw holes 66 of the cover 62 and sized uniformly so that screws 68 may pass through the screw holes 66 and fit appropriately into the threaded columns 76. Each shell 62, 64 may include a flange 99*b* and 99*a*, respectively, extending from lips 74, 72 respectively. The flange may nest within a complemental slit in the foam cavity 46 to further distribute the vibration.

Within the recess 65 of the base 64 are a plurality of motor mounting threaded columns 86. These motor mounting threaded columns 86 are fixedly attached to the base 64 and extend in an upward direction with the open portion on top. Also within the recess 65 are a plurality of ribs 78. These ribs 78 are shaped with a lower flat edge fixedly attached to the upper surface of the base 64 within and on the floor defining recess 65. The ribs have two flat vertical edges and an upper arcuate edge forming a concave saddle. The plurality of ribs 78 are arranged in parallel planes substantially orthogonal to the long axis of the oval-shaped base 64. Also extending upwardly from the recess 65 of the base 64 is a plurality of motor end supports 79 against which one end of a motor abuts. Each support 79 is substantially a rectangular flat plate.

Upon the ribs 78 and against the motor end supports 79, within the recess 65 of the base 64 fits a motor 52. This motor 52 is substantially cylindrical in shape with a radius of curvature similar to that of the upper arcuate edges of the ribs 78, forming a solid connection. A plurality of hold down straps 80 comprised of thin strips bent to form a radius of curvature similar to that of the motor 52 fit snugly over the motor 52. Extending horizontally outwardly from each end of each hold down strap 80 are attachment tabs 82. Preferably one attachment tab 82 is located on each end of each hold down strap 80. Each attachment tab 82 has a motor mounting screw hole 84 in its center allowing a screw 68 to pass vertically therethrough. The number of motor mounting threaded columns 86 is equal to the number of attachment tabs 82. Each motor mounting threaded column 86 is sized and located so that when the motor 52 is on the ribs 78 and the hold down straps 80 are on the motor 52, then the protruding attachment tabs 82 will be aligned directly above the motor mounting threaded column 86. This allows screws 68 to be placed through the attachment tabs 82 and into the motor mounting threaded columns 86 providing a secure attachment of the motor 52 to the base 64.

A load shaft 56 extends axially outwardly from the cylindrically shaped motor 52 on one end remote from supports 79. The load shaft 56 is operatively connected to said motor 52 so that when power is supplied to the motor 52, the load shaft 56 revolves about its long axis. Attached to the end of the load shaft 56 is a mass 54. The mass 54 is preferably of uniform thickness and substantially elliptical in cross-section. The mass 54 is fixedly attached to the load shaft 56 with the long axis of the load shaft 56 normal to the plane that creates the elliptical cross-section of the mass 54. The point of attachment is not at the center of mass of the elliptical mass 54 but rather at some other point, for instance, one of the two foci ellipse. This unbalanced attachment of the mass 54 to the load shaft 56 creates the vibrations central to use of the chair 100.

When the vibration source 50 is properly assembled and power is supplied to the motor 52, the mass 54 begins to spin, creating and imparting vibration to the motor 52. The vibration is propagated from the motor 52 through the ribs 78, motor end supports 79, and hold down straps 80 to the base 64 of the vibration source 50. Vibration also propagates through the cover 62. Thus, vibration then propagates from the vibration source 50 to both the central core 45 of the furniture portions 41 and 42 and also through the outer facia 44 to the individual user.

Figure 3:
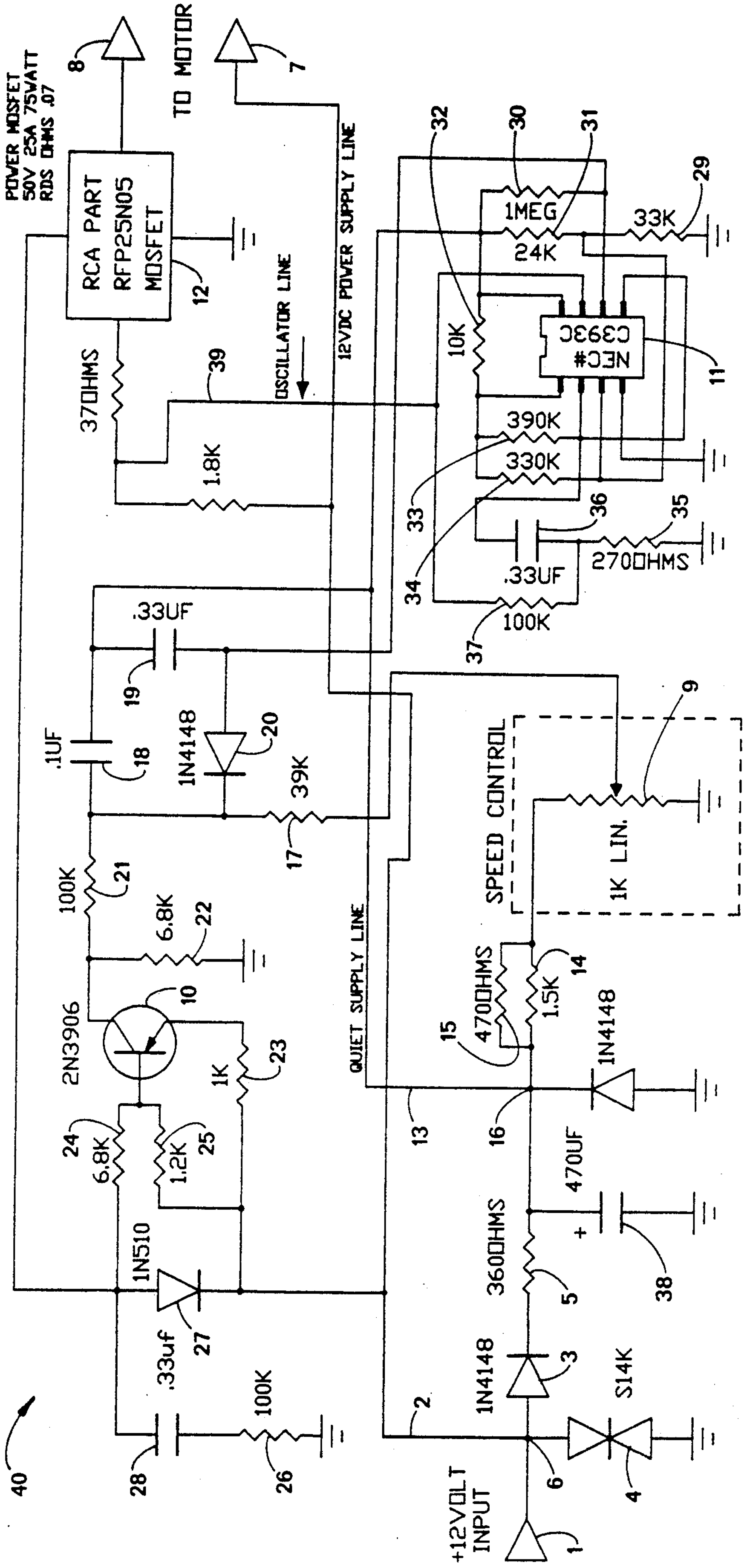
FIG. 3 is a circuit schematic diagram of the vibration control circuit diagram of the vibration signal.

The power is supplied to the motor 52 by way of a power cord 90 connected between the motor 52 and a signal box 59. The signal box 59 is located strategically near the user. Within the signal box 59 is the signal modifying and heat reducing circuit 40 as shown in FIG. 3. An input enters the signal modifying and heat reducing circuit 40 from a 12 volt power supply and exits the circuit 40 and signal box 59 by way of the power cord 90. An adjustment dial 58 externally varies the voltage output of the circuit 40.

Specifically, the signal modifying and heat dissipating circuit 40 is made up of an input terminal 1, through which a +12 volt input signal is applied to the circuit 40, which supplies the power supply line output to the motor at junction terminal 7 and also supplies opposing junction terminal 8 through linear variable resistor (pot) 9, transistor 10 and accompanying components, dual low-power voltage comparator 11 and accompanying loop, and MOSFET 12. MOSFET 12 is a higher current MOS type field effect transistor such as an RCA No. RFP25No05 or equivalent. More specifically, input terminal 1 supplies junction terminal 7 via node 6 through conductor 2. Additionally, at node 6, a double-anode regulator 4 protects the circuit from both negative and positive overloads. Junctions 7, 8 may be configured to feed several vibrating sources.

Further, input terminal 1 is connected through node 6 to diode 3, which prevents backflow of current due to any circuit irregularities, then to resistor 5 which is connected to capacitor 38. Capacitor 38 insures that the oscillator in comparator 11 starts. At node 16 the current branches off to conductor 13 (which is a quiet supply line/feedback loop) and to parallel resistors 14 and 15 and thence to the linear variable resistor (pot) 9. Pot 9 controls the speed of vibration by allowing the resistance to be externally varied. That is, when the resistance is varied in pot 9, voltage is varied likewise. Feedback loop 13 enables further speed control so that the output pulses are not irregular. This voltage variance is significant since the remainder of the circuit loop is voltage regulated due to MOSFET 12 and voltage comparator 11.

The signal thus generated is applied to transistor 10 and its accompanying component loop. Specifically, the signal proceeds from pot 9 to resistor 17 and in part to capacitors 18 and 19 and diode 20, then to voltage comparator 11. From resistor 17 the signal also proceeds directly to the transistor loop that consists of resistors 21–26, transistor 10, diode 27 and capacitor 28. Diode 27, as depicted, prevents reverse polarity of MOSFET 12.

Voltage comparator 11 and its accompanying gain loop, consisting of capacitor 36 and resistors 29–35 and 37, acts as a voltage stabilizer/regulator thereby supplying pulse-width modulation. Via oscillation line 39 (i.e. voltage comparator 11 output), comparator 11 aids in the overall functioning of MOSFET 12, which requires high-voltage, saturating inputs to act properly. MOSFET 12, which leads to motor terminal 8, is the motor driver for this circuit.

In this way, the signal modifying and heat reducing circuit 40 provides a means for both vibrational frequency and amplitude control solely through the adjustment dial 58 (connected to pot 9) and also provides for substantial heat reduction, thereby protecting the motor 52. This heat reduction results from the application of a pulse-modulated signal being applied to motor 52 rather than a constant voltage and current level.

In use and operation, one seated in the chair 100 operatively conditions the knob 58 in order to energize the circuit shown in FIG. 3. The circuit in turn, imparts energy to the motor or motors allowing the load shaft 56 to rotate, imparting spin on the eccentric 54 generating vibration through the housing.

Others may resort to structural modifications of the above-described preferred embodiment of the invention without departing from its scope and fair meaning as set forth hereinabove and as further described hereinbelow in the claims.

For example, although the circuit details were discussed within the framework of a DC circuit, AC power can be conditioned by means of a triac to achieve similar results. In addition, signal modifying and heat reducing circuit 40 which includes pulse width modulation although described in an analog environment, could also be digitized.

I claim:

1. A chair-like article of furniture for providing vibrational sensation to a user, comprising:

(a) an upper furniture back portion providing support for the user's upper torso;

(b) a lower furniture seat portion providing support for the user's lower torso, said upper furniture back portion and said lower furniture seat portion operatively coupled to generally define a chair;

(c) a plurality of electric motor vibration sources located within said upper furniture back portion and said lower furniture seat portion;

(d) a motor driving circuit means for supplying both pulse-width modulation and voltage regulation/-stabilization while providing necessary voltage to control said electric motor vibration sources said motor driving circuit means including a comparator; and (e) a speed control external to said motor driving circuit and operatively coupled thereto allowing variation in vibrational frequency of said electric motor vibration sources connected to said motor driving circuit.

2. The apparatus recited in claim 1 wherein said speed control is a linearly variable resistor.

3. The apparatus recited in claim 1 wherein said upper furniture back portion and said lower furniture seat portion comprises:

(a) an outer facia covering said upper furniture back portion and said lower furniture seat portion having sufficient thickness and consistency to ameliorate and soften inner structural components which otherwise would directly contact the user;

(b) a central core providing said upper furniture back portion and said lower furniture seat portion with structural support, and providing a medium to contain said electric motor vibration sources, and providing a medium to propagate vibrations to said outer facia; and (c) a plurality of cavities formed in said central core housing said electric motor vibration sources.

4. The apparatus recited in claim 1 wherein each electric motor vibration source in said plurality of electric motor vibration sources comprises:

(a) an electric motor;

(b) a load shaft driven by said electric motor;

(c) an eccentric mass fixedly attached to said load shaft;

(d) a housing within which said electric motor and said eccentric mass is securely mounted, said housing comprising an upper cover with a plurality of screw holes and a lower base with a plurality of threaded columns fastened together with a plurality of screws; and (e) a power cord connecting said motor to said motor driving circuit.

5. The apparatus recited in claim 4 wherein said electric motor vibration sources are connected to said motor driving circuit through a junction means, whereby adjustment of said speed control will simultaneously adjust all of said electric motor vibration sources connected to said junction means.

6. The apparatus recited in claim 4 wherein said electric motor is a direct current motor with said load shaft extending along the central axis of said electric motor.

7. The apparatus recited in claim 4 wherein said eccentric mass is fixedly attached to said load shaft at a point which is displaced from the center said eccentric mass, so that the center of mass of said eccentric mass is not coincident with the axis rotation of said eccentric mass, whereby said eccentric mass will cause said electric motor to vibrate thus causing said housing to vibrate and finally causing said lower furniture seat portion or said upper furniture back portion to vibrate.

8. The apparatus recited in claim 4 wherein said housing forms a secure enclosure for said motor and further comprises:

(a) a tab extending downwardly along an edge of said upper cover; and (b) a tab extending upwardly along an edge of said base, where said downwardly extending tab is slightly recessed away from the outer edges of said cover and said upwardly extending tab is not recessed, whereby said upper cover will lock snugly over said base and bring said screw holes and said threaded columns into axial alignment.

9. The apparatus recited in claim 8 wherein said base further comprises:

(a) a plurality of ribs extending up from a floor of said base for mounting said motor;

(b) a plurality of brackets consisting of strips bent to conform to an outer surface of said motor thereby fitting snugly over said motor, said strips provided with attachment tabs extending from ends thereof and with motor-mounting screw holes in said tabs; and (c) a plurality of motor-mounting threaded columns extending upwardly from said floor of said base, one for each said tab of each said bracket, and screws attaching said brackets to said base thus securely fastening said motor to said housing so that all vibration of said electric motor will translate to said housing.

10. A vibrational source, comprising:

(a) An electric motor;

(b) a load shaft extending from said electric motor;

(c) an eccentric mass fixedly attached to said load shaft;

(d) a housing within which said electric motor and said eccentric mass are securely mounted, said housing including an upper cover with a plurality of screw holes and a lower base with a plurality of threaded columns fastened together with a plurality of screws;

(e) a motor driving circuit means for supplying both pulse-width modulation and voltage regulation/-stabilization while providing necessary voltage to control said electric motor vibration sources;

(f) a speed control external to said motor driving circuit sources, said motor driving circuit means including a comparator vibrational frequency of said electric motor vibration sources; and (g) a power cord for connecting said electric motor to said motor driving circuit.

11. The apparatus recited in claim 10 wherein said electric motor is a direct current motor where said load shaft extends along the central axis of said electric motor.

12. The apparatus recited in claim 10 wherein said eccentric mass is displaced from the center of said eccentric mass, so that the center of mass of said eccentric mass is not coincident with the axis of rotation of said eccentric mass, whereby said eccentric mass will cause said motor to vibrate thus causing said housing to vibrate.

13. The apparatus recited in claim 10 wherein said housing forms a secure enclosure for said electric motor with a cover and a base by a tab extending downwardly along an edge of said cover and a tab extending upwardly along an edge of said base, where said downwardly extending tab is slightly recessed away from the outer edges of said cover and said upwardly extending tab is not recessed, whereby said cover will lock snugly over said base and bring said screw holes and said threaded columns in proper alignment.

14. The apparatus recited in claim 13, wherein said base comprises:

(a) a plurality of ribs for mounting said electric motor carried on a ventilated floor;

(b) a plurality of brackets on said floor consisting of strips bent to conform to the outer surface of said electric motor fitting snugly over said electric motor with attachment tabs extending from both ends of said brackets with motor-mounting screw holes in said tabs; and (c) a plurality of motor-mounting threaded columns extending upwardly from said base, one for each tab of each bracket, whereby screws may attach said brackets to said base thus securely fastening said motor to said oval-shaped housing so that all vibration of said motor will translate to said housing.

15. An electric circuit for providing a desired signal with substantial hear reduction characteristics for use in a vibrational structure, comprising:

(a) a power source;

(b) a voltage driven MOSFET;

(c) a comparator, said comparator being operatively coupled to said power source, said comparator producing a pulse-width modulated voltage signal to operate said MOSFET; and (d) control means for varying the amplitude of said pulse-width modulated voltage signal.

16. The apparatus as recited in claim 15, further comprising:

(a) an input terminal, said power source connected to said input terminal;

(b) an output terminal; and (c) a vibratory motor, said vibratory motor connected to said output terminal, said vibratory motor operatively coupled to said MOSFET, the vibration rate of said vibratory motor being responsive to said control means.

17. The apparatus as recited in claim 16, further comprising:

(a) a housing surrounding said vibratory motor, said housing formed from two shells which when closed collectively define a substantially hollow oval construct;

(b) a saddle supporting said motor and fixed to one of said two shells; and (c) a vehicle seat within which said housing is embedded, said vehicle seat having a hollow to receive said housing.

* * * * *

UNITED STATES PATENT AND TRADEMARK OFFICE

CERTIFICATE OF CORRECTION

PATENT NO. : 5,022,384
DATED : June 11, 1991
INVENTOR(S) : Jack Freels and David Milton It is certified that error appears in the above-identified patent and that said Letters Patent is hereby corrected as shown below:

<u>Column 4,</u>
Line 1, delete "circuit"
Line 2, delete "diagram of the vibration signal"
Line 27, change "higher" to -- high --
Line 29, change "RFP25No05" to -- RFP25N05 --

<u>Column 6,</u>
Line 19, change "dissipating" to -- reducing --

<u>Column 7,</u>
Line 43, after "sources" insert -- , --

<u>Column 8,</u>
Line 65, change "An" to -- an --

<u>Column 9,</u>
Line 10, change "sources" to -- sources, said motor driving circuit means including a comparator --
Line 12, change "sources, said motor driving circuit means" to -- and operatively coupled thereto allowing variations in --
Line 13, delete "including a comparator"

<u>Column 10,</u>
Line 12, change "hear" to -- heat --

Signed and Sealed this

Sixteenth Day of December, 2003

JAMES E. ROGAN
*Director of the United States Patent and Trademark Office*